United States Patent
Lai et al.

(10) Patent No.: US 10,103,516 B2
(45) Date of Patent: Oct. 16, 2018

(54) SEMICONDUCTOR LASER DEVICE

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/409,157

(22) Filed: Jan. 18, 2017

(65) Prior Publication Data
US 2018/0138663 A1    May 17, 2018

(30) Foreign Application Priority Data
Nov. 17, 2016    (TW) .............................. 105137637 A

(51) Int. Cl.
| | | |
|---|---|---|
| *H01S 3/097* | (2006.01) | |
| *H01S 5/00* | (2006.01) | |
| *H01S 5/22* | (2006.01) | |
| *H01S 5/042* | (2006.01) | |
| *H01S 5/10* | (2006.01) | |
| *H01S 5/183* | (2006.01) | |
| *H01S 5/20* | (2006.01) | |

(52) U.S. Cl.
CPC .............. *H01S 5/22* (2013.01); *H01S 5/0425* (2013.01); *H01S 5/10* (2013.01); *H01S 5/18308* (2013.01); *H01S 5/18394* (2013.01); *H01S 5/2018* (2013.01)

(58) Field of Classification Search
CPC ...... H01S 5/22; H01S 5/2018; H01S 5/18308; H01S 5/18394; H01S 5/10; H01S 5/0425
See application file for complete search history.

(56) References Cited

U.S. PATENT DOCUMENTS

| | | | | |
|---|---|---|---|---|
| 5,909,459 A | * | 6/1999 | Ishibashi ................ | B82Y 20/00 257/94 |
| 2013/0016751 A1 | * | 1/2013 | Takado ................ | H01S 5/0425 372/45.01 |
| 2014/0319456 A1 | * | 10/2014 | Ikeda ...................... | H01L 31/00 257/13 |

FOREIGN PATENT DOCUMENTS

| | | |
|---|---|---|
| CN | 103119808 | 5/2013 |
| CN | 104300364 | 1/2015 |
| TW | 521448 | 2/2003 |

OTHER PUBLICATIONS

"Office Action of Taiwan Counterpart Application," dated Jun. 9, 2017, p. 1-p. 6, in which the listed references were cited.

* cited by examiner

*Primary Examiner* — Yuanda Zhang
(74) *Attorney, Agent, or Firm* — J.C. Patents

(57) ABSTRACT

A semiconductor laser device includes a semiconductor epitaxial structure, an electrode pad layer, and a transparent conductive layer. The semiconductor epitaxial structure includes a first semiconductor layer, a second semiconductor layer, and a light emitting layer. The light emitting layer is disposed between the first semiconductor layer and the second semiconductor layer, and the first semiconductor layer is disposed between the electrode pad layer and the light emitting layer. The transparent conductive layer is disposed between the electrode pad layer and the first semiconductor layer. The first semiconductor layer has a ridged structure on one side away from the light emitting layer. The electrode pad layer has at least one empty area, and an orthogonal projection of the at least one empty area along a direction perpendicular to the light emitting layer is overlapped with at least a portion of an orthogonal projection of the ridged structure along the direction.

18 Claims, 7 Drawing Sheets

SEMICONDUCTOR LASER DEVICE

CROSS-REFERENCE TO RELATED APPLICATION

This application claims the priority benefit of Taiwan application serial no. 105137637, filed on Nov. 17, 2016. The entirety of the above-mentioned patent application is hereby incorporated by reference herein and made a part of this specification.

BACKGROUND OF THE INVENTION

1. Field of the Invention

The invention relates to a semiconductor light emitting device. More particularly, the invention relates to a semiconductor laser device.

2. Description of Related Art

With the progress of semiconductor technologies, the launch of semiconductor laser technologies has significantly changed people's lives. Laser diodes (LD) characterized by high energy efficient, small volume, and light weight have been applied in various fields including fiber-optic communication, optical discs, laser printers, laser scanners, laser indicators, etc. In general, the semiconductor laser may be categorized into an edge emitting laser (EEL) and a vertical cavity surface emitting laser (VCSEL) according to structural differences of the direction of the laser resonator relative to the plane of the light emitting layer.

In an EEL device, a semiconductor layer with proper refraction index and band-gap design may be arranged on two sides of the light emitting layer; the arrangement of the refraction index and band-gap design of the semiconductor layer and the light emitting layer allows the semiconductor layer and the light emitting layer to form a double heterojunction (DJ) structure, so as to confine the carriers. In general, electrodes or electrode pads are arranged on the semiconductor layer at two sides of the light emitting layer. After the semiconductor laser device is electrically connected to a circuit substrate, electrons and holes may be provided to the semiconductor laser device through the electrodes or the electrode pads and may be re-combined in the light emitting layer, so as to emit light. The light coming from the light emitting layer is then transformed into a laser beam with a narrow full width at half maximum (FWHM) in the laser resonator characterized by optical confinement effects and formed in the semiconductor laser device structure. Generally, the electrode pads are designed to completely cover the semiconductor layer, so as to evenly supply the electrical current to the semiconductor laser device. However, when the light coming from the light emitting layer passes through the electrode pads, a portion of the light is absorbed by the electrode pads made of metal materials, which may lead to certain optical loss of the semiconductor laser device. Hence, it is not easy for the semiconductor laser device to take both the electrical performance and the optical performance into consideration, and thus the light emitting efficiency of the semiconductor laser device cannot be easily improved.

SUMMARY OF THE INVENTION

The invention provides a semiconductor laser device with small optical loss and favorable light emitting efficiency without sacrificing electrical and optical performance.

In an embodiment of the invention, a semiconductor laser device includes a semiconductor epitaxial structure, an electrode pad layer, and a transparent conductive layer. The semiconductor epitaxial structure includes a first semiconductor layer, a second semiconductor layer, and a light emitting layer. The light emitting layer is disposed between the first semiconductor layer and the second semiconductor layer, and the first semiconductor layer is disposed between the electrode pad layer and the light emitting layer. The transparent conductive layer is disposed between the electrode pad layer and the first semiconductor layer. The first semiconductor layer has a ridged structure on one side away from the light emitting layer. The electrode pad layer has at least one empty area, and an orthogonal projection of the at least one empty area along a direction perpendicular to the light emitting layer is overlapped with at least one portion of an orthogonal projection of the ridged structure along the direction.

According to an embodiment of the invention, the ridged structure has a top surface away from the light emitting layer, and the orthogonal projection of the at least one empty area on the top surface is overlapped with at least one portion of the top surface.

According to an embodiment of the invention, a shape of the top surface is identical to a shape of the at least one empty area, and the top surface coincides with the orthogonal projection of the at least one empty area on the top surface.

According to an embodiment of the invention, a quantity of the at least one empty area is plural, and the orthogonal projections of the empty areas on the top surface are respectively overlapped with one portion of the top surface.

According to an embodiment of the invention, the electrode pad layer includes a first portion and a plurality of second portions connected to the first portion. The second portions of the electrode pad layer are disposed on the top surface and are arranged at regular intervals.

According to an embodiment of the invention, one side of the first semiconductor layer away from the light emitting layer has a peripheral surface. The ridged structure includes a side surface and a top surface, and the side surface of the ridged structure connects the top surface of the ridged structure to the peripheral surface. The semiconductor laser device further includes an insulation layer disposed between the first semiconductor layer and the transparent conductive layer, and the insulation layer covers at least one portion of the peripheral surface.

According to an embodiment of the invention, the insulation layer covers the side surface of the ridged structure and one portion of the top surface of the ridged structure.

According to an embodiment of the invention, the insulation layer covers the side surface of the ridged structure, and the insulation layer and the top surface of the ridged structure are aligned with a horizontal plane.

According to an embodiment of the invention, the transparent conductive layer covers at least one portion of the insulation layer. The transparent conductive layer covers the top surface of the ridged structure.

According to an embodiment of the invention, an orthogonal projection of the transparent conductive layer along a direction perpendicular to the light emitting layer coincides with an orthogonal projection of the top surface of the ridged structure along the direction.

According to an embodiment of the invention, the first semiconductor layer further includes a first semiconductor cladding layer of a first doped type and a first waveguide layer of the first doped type, and the second semiconductor layer further includes a second semiconductor cladding layer of a second doped type and a second waveguide layer of the second doped type. The first waveguide layer is disposed between the first semiconductor cladding layer and the light emitting layer, and the second waveguide layer is disposed between the second semiconductor cladding layer and the light emitting layer. One of the first doped type and the second doped type is a p-type, and the other is an n-type.

According to an embodiment of the invention, the first semiconductor layer further includes a semiconductor contact layer of the first doped type, and the semiconductor contact layer is disposed between the transparent conductive layer and the first semiconductor cladding layer. The semiconductor contact layer is in contact with the transparent conductive layer.

According to an embodiment of the invention, the semiconductor laser device is an edge emitting laser (EEL).

According to an embodiment of the invention, the electrode pad layer has an identical electrical property.

In view of the above, the semiconductor epitaxial structure of the semiconductor laser device provided herein includes the first semiconductor layer, the second semiconductor layer, and the light emitting layer. The light emitting layer is disposed between the first semiconductor layer and the second semiconductor layer, and the first semiconductor layer has the ridged structure on one side away from the light emitting layer. The first semiconductor layer is disposed between the electrode pad layer and the light emitting layer, and the transparent conductive layer is disposed between the electrode pad layer and the first semiconductor layer. Besides, the electrode pad layer has at least one empty area, and an orthogonal projection of the at least one empty area along a direction perpendicular to the light emitting layer is overlapped with at least one portion of an orthogonal projection of the ridged structure along the direction. That is, the electrode pad layer does not completely cover the ridged structure of the first semiconductor layer and thus does not absorb a significant amount of light emitted by the light emitting layer; as such, the optical loss of the semiconductor laser device is reduced. In addition, the transparent conductive layer may disperse the electrical current supplied from the outside to the electrode pad layer, such that the electrical current may evenly enter the semiconductor epitaxial structure. As a result, the semiconductor laser device provided herein may have small optical loss and favorable light emitting efficiency without sacrificing electrical and optical performance.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
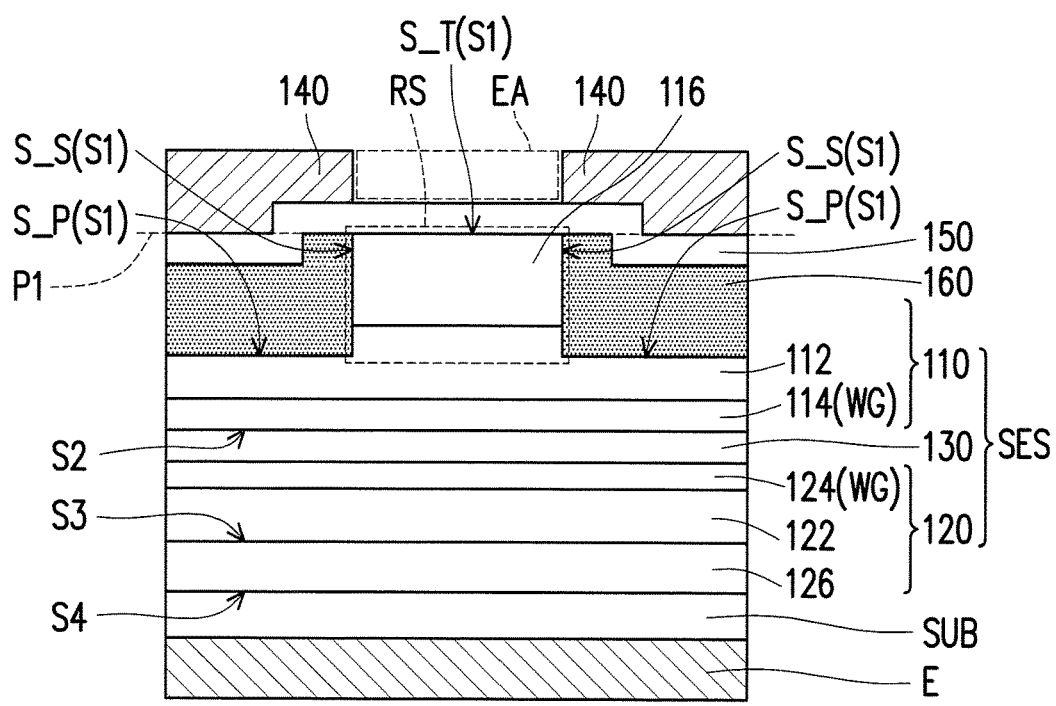
FIG. 1A is a schematic cross-sectional view of a semiconductor laser device according to an embodiment of the invention.

FIG. 1A is a schematic cross-sectional view of a semiconductor laser device according to an embodiment of the invention. Please refer to FIG. 1A. In order to clearly illustrate the structure of each layer in the semiconductor laser device 100, each layer depicted in FIG. 1A has appropriate size and thickness. The size and the thickness of each layer in the semiconductor laser device 100 are not limited to those depicted in FIG. 1A. In the present embodiment, the semiconductor laser device 100 includes a semiconductor epitaxial structure SES. The semiconductor epitaxial structure SES includes a first semiconductor layer 110, a second semiconductor layer 120, and a light emitting layer 130. The light emitting layer 130 is disposed between the first semiconductor layer 110 and the second semiconductor layer 120.

Specifically, the semiconductor laser device 100 is a laser diode (LD) and is, for instance, an edge emitting laser (EEL). In the semiconductor laser device 100, the first semiconductor layer 110 includes a first semiconductor cladding layer 112 of a first doped type, and the second semiconductor layer 120 includes a second semiconductor cladding layer 122 of a second doped type. Besides, each of the first semiconductor layer 110 and the second semiconductor layer 120 includes a waveguide layer WG. Particularly, the waveguide layer WG of the first semiconductor layer 110 includes a first waveguide layer 114 of the first doped type, and the waveguide layer WG of the second semiconductor layer 120 includes a second waveguide layer 124 of the second doped type. The first waveguide layer 114 is disposed between the first semiconductor cladding layer 112 and the light emitting layer 130, and the second waveguide layer 124 is disposed between the second semiconductor cladding layer 122 and the light emitting layer 130. In addition, the first semiconductor layer 110 further includes a semiconductor contact layer 116 of the first doped type, and the second semiconductor layer 120 further includes a semiconductor material layer 126 of the second doped type. The first semiconductor cladding layer 112 is disposed between the semiconductor contact layer 116 and the first waveguide layer 114, and the second semiconductor cladding layer 122 is disposed between the second waveguide layer 124 and the semiconductor material layer 126.

According to the present embodiment, the first semiconductor layer 110 and the second semiconductor layer 120 have different conductive types. One of the first doped type and the second doped type is a p-type, and the other is an n-type. Here, the first doped type is the p-type, and the second doped type is the n-type. Namely, the semiconductor cladding layer 112, the first waveguide layer 114, and the semiconductor contact layer 116 of the first semiconductor layer 110 are p-type, for instance, and the semiconductor cladding layer 122, the second waveguide layer 124, and the semiconductor material layer 126 of the second semiconductor layer 120 are n-type. Nevertheless, the present invention should not be construed as limited to the embodiments set forth herein. Said n-type may be implemented by doping silicon (Si), for instance, and said p-type may be implemented by doping magnesium (Mg), for instance. The invention is not limited thereto.

According to the present embodiment, the first semiconductor cladding layer 112 and the second semiconductor cladding layer 122 are made of gallium nitride (GaN), aluminum indium gallium nitride (AlInGaN), or any other group III-V semiconductor compound. Besides, the material of the first waveguide layer 114 and the second waveguide layer 124 may include indium gallium nitride (InGaN) or GaN, for instance. Practically, another wavelength guide layer WG (e.g., an unintentionally doped waveguide layer WG) may be disposed between the first semiconductor layer 110 and/or the second semiconductor layer 120 according to actual light emitting demands, which should not be construed as a limitation to the invention. In addition, according to the present embodiment, the semiconductor contact layer 116 and the semiconductor material layer 126 are made of GaN or any other group III-V semiconductor compound. In some embodiments of the invention, the first semiconductor layer 110 may further include a semiconductor material layer disposed between the semiconductor contact layer 116 and the first semiconductor cladding layer 112, and the material of the semiconductor material layer may be the same as or different from the material of the semiconductor contact layer 116, which should not be construed as a limitation to the invention.

In the present embodiment, at least the first semiconductor cladding layer 112, the semiconductor contact layer 116, the second semiconductor cladding layer 122, and the semiconductor material layer 126 may have the single layer structures, multi-layered structures, supper lattice (SL) structures, or structures of any other type. For instance, the first semiconductor cladding layer 112 and the second semiconductor cladding layer 122 may have the SL structures constituted by stacking alternately a plurality of AlInGaN layers and a plurality of GaN layers, for instance. Besides, the materials and the structures of at least the first semiconductor cladding layer 112, the semiconductor contact layer 116, the second semiconductor cladding layer 122, and the semiconductor material layer 126 may be the same or different, which should however not be construed as a limitation to the invention. In the present embodiment, the light emitting layer 130 may include a multiple quantum well (MQW) structure or a quantum well (QW) structure. For instance, the light emitting layer 130 may include the MQW structure formed by alternately stacking a plurality of GaN layers and a plurality of InGaN layers, and the MQW structure of the light emitting layer 130 may be the SL structure. The invention is not limited thereto.

Please refer to FIG. 1A again. In the present embodiment, the semiconductor laser device 100 further includes an electrode pad layer 140 and a transparent conductive layer 150. The first semiconductor layer 110 is disposed between the electrode pad layer 140 and the light emitting layer 130, and the transparent conductive layer 150 is disposed between the electrode pad layer 140 and the first semiconductor layer 110. The transparent conductive layer 150 may be made of indium tin oxide (ITO) or a transparent conductive material of another type, and the electrode pad layer 140 may be made of metal or any other conductive material, which should however not be construed as a limitation to the invention. Here, the electrode pad layer 140 has an identical electrical property. The first semiconductor layer 110 has a ridged structure RS on one side away from the light emitting layer 130. Specifically, the first semiconductor layer 110 has a first side S1 away from the light emitting layer 130 and a second side S2 facing the light emitting layer 130, and the ridged structure RS is located on the first side S1. Here, the ridged structure RS includes but is not limited to the semiconductor contact layer 116 and a portion of the first semiconductor cladding layer 112 of the first semiconductor layer 110.

In the present embodiment of the invention, one side of the first semiconductor layer 110 away from the light emitting layer 130, i.e., the first side S1, has a peripheral surface S_P. Besides, the ridged structure RS located on the first side S1 includes a side surface S_S and a top surface S_T, and the side surface S_S of the ridged structure RS connects the top surface S_T of the ridged structure RS to the peripheral surface SP. Particularly, the semiconductor laser device 100 further includes an insulation layer 160 disposed between the first semiconductor layer 110 and the transparent conductive layer 150, and the insulation layer 160 covers at least one portion of the peripheral surface S_P. In detail, the insulation layer 160 covers the side surface S_S of the ridged structure RS, and the insulation layer 160 and the top surface S_T of the ridged structure RS are aligned to a horizontal plane P1, such that the contact area of the semiconductor contact layer 116 and the transparent conductive layer 150 acting for subsequently conducting electricity can be maximized, so as to enhance the conductive efficiency. Additionally, the transparent conductive layer 150 covers at least one portion of the insulation layer 160 and covers the top surface S_T of the ridged structure RS. Note that the transparent conductive layer 150 may also be merely disposed on the top surface S_T, so as to reduce the manufacturing costs while maintaining the conductive efficiency, given that the electrical connection among the electrode pad layer 140, the transparent conductive layer 150, and the semiconductor contact layer 116 is ensured. A material of the insulating layer 160 may include silicon dioxide or any other suitable insulation material, for instance. Besides, in some embodiments of the invention, the insulation layer 160 may completely cover the peripheral surface SP or merely cover a portion of the peripheral surface S_P according to actual light emitting demands, and the insulation layer 160 may completely cover the side surface S_S or merely cover a portion of the side surface S_S. Besides, it is also possible for the insulation layer 160 to cover a portion of the top surface S_T, which should not be construed as a limitation to the invention.

According to the present embodiment, the semiconductor contact layer 116 is disposed between the transparent conductive layer 150 and the first semiconductor cladding layer 112, and the semiconductor contact layer 116 is in contact with the transparent conductive layer 150. Specifically, the semiconductor contact layer 116 is configured to ensure the favorable ohmic contact between the semiconductor contact layer 116 and the transparent conductive layer 150. Additionally, the transparent conductive layer 150 is electrically connected to the electrode pad layer 140, and the transparent conductive layer 150 is electrically connected to the first semiconductor layer 110 through the top surface S_T of the ridged structure RS.

In the present embodiment, the semiconductor laser device 100 further includes a substrate SUB and an electrode E that are disposed on one side of the semiconductor material layer 126 away from the light emitting layer 130. Specifically, the semiconductor material layer 126 has a third side S3 facing the light emitting layer 130 and a fourth side S4 away from the light emitting layer 130, and the substrate SUB and the electrode E are located on the fourth side S4. According to the present embodiment, the semiconductor material layer 126 is disposed between the second semiconductor cladding layer 122 and the electrode E, and the substrate SUB is disposed between the semiconductor material layer 126 and the electrode E. The electrode E is electrically connected to the semiconductor material layer 126. Particularly, the semiconductor laser device 100 is electrically connected to corresponding external electrodes through the electrode pad layer 140 on the first side S1 and the electrode E on the fourth side S4, and the light emitting layer 130 emits light through the electrical current transmitted by the corresponding external electrodes.

In the embodiment, the substrate SUB is, for example, made of GaN or any other conductive material. In some embodiments, the substrate SUB is made of a single crystalline compound whose lattice constant is close to that of the semiconductor material layer 126. Besides, in some embodiments, the semiconductor laser device 100 may further include an unintentionally doped semiconductor layer disposed between the semiconductor material layer 126 and the substrate SUB. The unintentionally doped semiconductor layer may be made of unintentionally doped GaN (u-GaN) or any other semiconductor compound. Besides, in some embodiments, the semiconductor laser device 100 may further include a semiconductor buffer layer disposed between the unintentionally doped semiconductor layer 126 and the substrate SUB. The semiconductor buffer layer is configured to release stress to an appropriate extent, so as to improve the epitaxial quality of the semiconductor laser device 100.

Figure 1B:
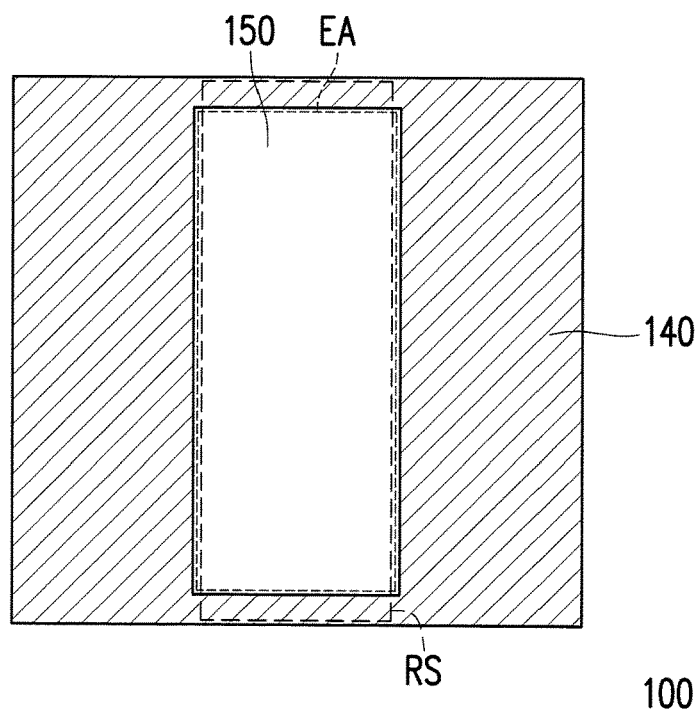
FIG. 1B is a schematic top view illustrating the semiconductor laser device according to the embodiment depicted in FIG. 1A.

FIG. 1B is a schematic top view illustrating the semiconductor laser device according to the embodiment depicted in FIG. 1A. Please refer to both FIG. 1A and FIG. 1B. In the present embodiment, the electrode pad layer 140 of the semiconductor laser device 100 has at least one empty area EA, and an orthogonal projection of the at least one empty area EA along a direction perpendicular to the light emitting layer 130 is overlapped with at least one portion of an orthogonal projection of the ridged structure RS along the direction. Particularly, the orthogonal projection of the at least one empty area EA on the top surface S_T is overlapped with at least one portion of the top surface S_T of the ridged structure RS. Namely, the electrode pad layer 140 does not completely cover the top surface S_T of the ridged structure RS. According to some embodiments of the invention, the electrode pad layer 140 may have a number of empty areas EA, and the orthogonal projections of the empty areas EA on the top surface S_T are respectively overlapped with one portion of the top surface S_T. For instance, the electrode pad layer 140 may have a plurality of openings, and locations of the openings respectively correspond to one portion of the top surface S_T, which should not be construed as a limitation to the invention.

In the present embodiment, the electrode pad layer 140 of the semiconductor laser device 100 has at least one empty area EA, and the orthogonal projection of the at least one empty area EA along a direction perpendicular to the light emitting layer 130 is overlapped with at least one portion of an orthogonal projection of the ridged structure RS along the direction. That is, the electrode pad layer 140 does not completely cover the ridged structure RS of the first semiconductor layer 110 of the semiconductor epitaxial structure SES and thus does not absorb a significant amount of light emitted by the light emitting layer 130; as such, the optical loss of the semiconductor laser device 100 is reduced. In addition, the transparent conductive layer 150 of the semiconductor laser device 100 may disperse the electrical current supplied from the outside to the electrode pad layer 140, such that the electrical current may evenly enter the semiconductor epitaxial structure SES. As a result, the semiconductor laser device 100 provided herein may have small optical loss and favorable light emitting efficiency without sacrificing electrical and optical performance.

Figure 2:
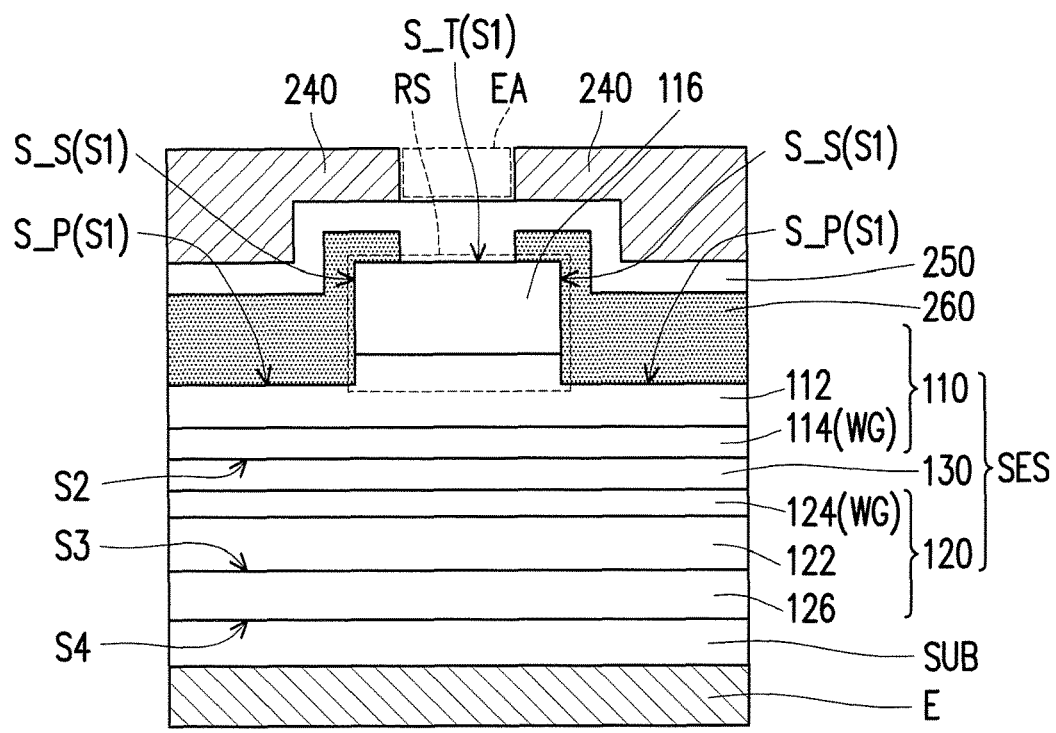
FIG. 2 is a schematic cross-sectional view of a semiconductor laser device according to another embodiment of the invention.

FIG. 2 is a schematic cross-sectional view of a semiconductor laser device according to another embodiment of the invention. Please refer to FIG. 2. The semiconductor laser device 200 depicted in FIG. 2 is similar to the semiconductor laser device 100 depicted in FIG. 1A and FIG. 1B. Components and functions thereof have been specified in the embodiments related to the semiconductor laser device 100 depicted in FIG. 1A and FIG. 1B and thus are not repeated hereinafter. The differences between the semiconductor laser devices 200 and 100 are described below. In the present embodiment, the insulation layer 260 of the semiconductor laser device 200 covers the side surface S_S and a portion of the top surface S_T of the ridged structure RS. Besides, the transparent conductive layer 250 is disposed between the electrode pad layer 240 and the insulation layer 260. The transparent conductive layer 250 covers the insulation layer 260 and covers the top surface S_T of the ridged structure RS. Particularly, the semiconductor laser device 200 provided in the present embodiment can achieve at least the effects that are accomplished by the semiconductor laser device 100 depicted in FIG. 1A and FIG. 1B, i.e., the semiconductor laser device 200 can have small optical loss and favorable light emitting efficiency without sacrificing electrical and optical performance.

Figure 3:
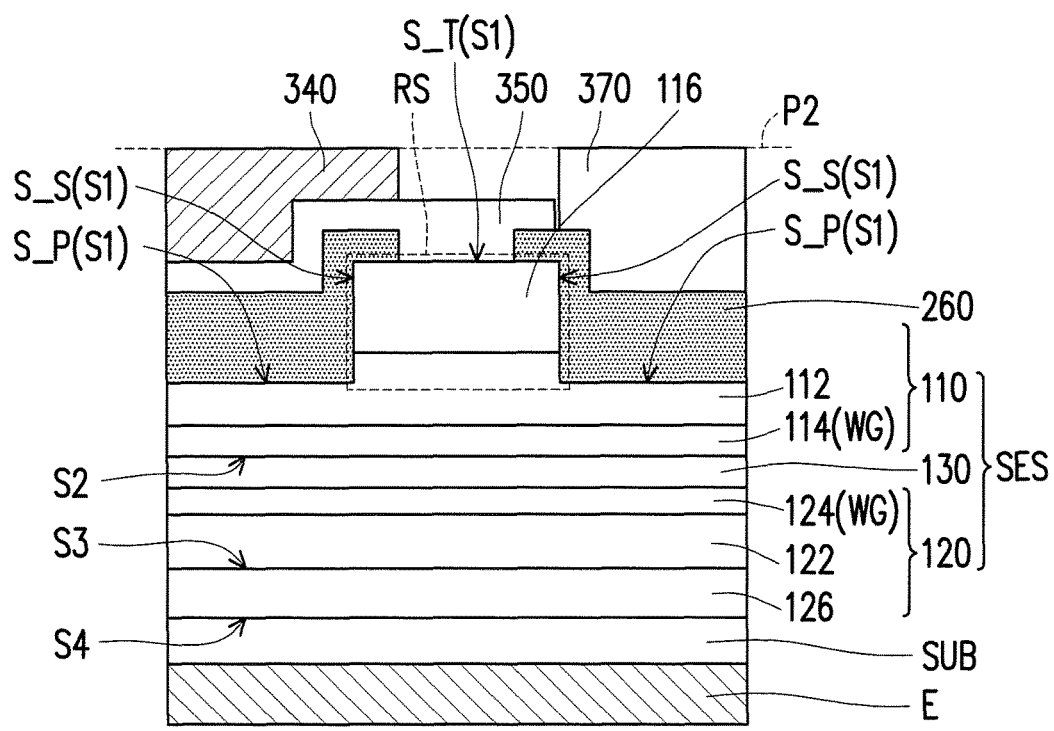
FIG. 3 is a schematic cross-sectional view of a semiconductor laser device according to another embodiment of the invention.

FIG. 3 is a schematic cross-sectional view of a semiconductor laser device according to another embodiment of the invention. Please refer to FIG. 3. The semiconductor laser device 300 depicted in FIG. 3 is similar to the semiconductor laser device 200 depicted in FIG. 2. Components and functions thereof have been specified in the embodiments related to the semiconductor laser device 200 depicted in FIG. 2 and thus are not repeated hereinafter. The differences between the semiconductor laser devices 300 and 200 are described below. In the present embodiment, the transparent conductive layer 350 of the semiconductor laser device 300 is located between the electrode pad layer 340 and the insulation layer 260. The transparent conductive layer 350 covers one portion of the insulation layer 260 but does not cover the other portion. No electrode pad layer 340 is disposed on the other portion of the insulation layer 260 which is not covered by the transparent conductive layer 350. Here, the semiconductor laser device 300 further includes a filler 370 disposed on the other portion of the insulation layer 260 which is not covered by the transparent conductive layer 350. Specifically, the filler 370 and the electrode pad layer 340 are aligned with a horizontal plane P2, for instance. In the present embodiment, the semiconductor laser device 300 may be bonded to a carrier substrate containing a circuit structure through the filler 370 and the electrode pad layer 340. The filler 370 not only can be configured to support the semiconductor laser device 300 to be well bonded to the carrier substrate but also can include materials which are conducive to heat dissipation, so as to enhance the heat dissipation performance of the semiconductor laser device 300. Particularly, the semiconductor laser device 300 provided in the present embodiment can achieve at least the effects that are accomplished by the semiconductor laser device 100 depicted in FIG. 1A and FIG. 1B, i.e., the semiconductor laser device 300 can have small optical loss and favorable light emitting efficiency without sacrificing electrical and optical performance.

Figure 4:
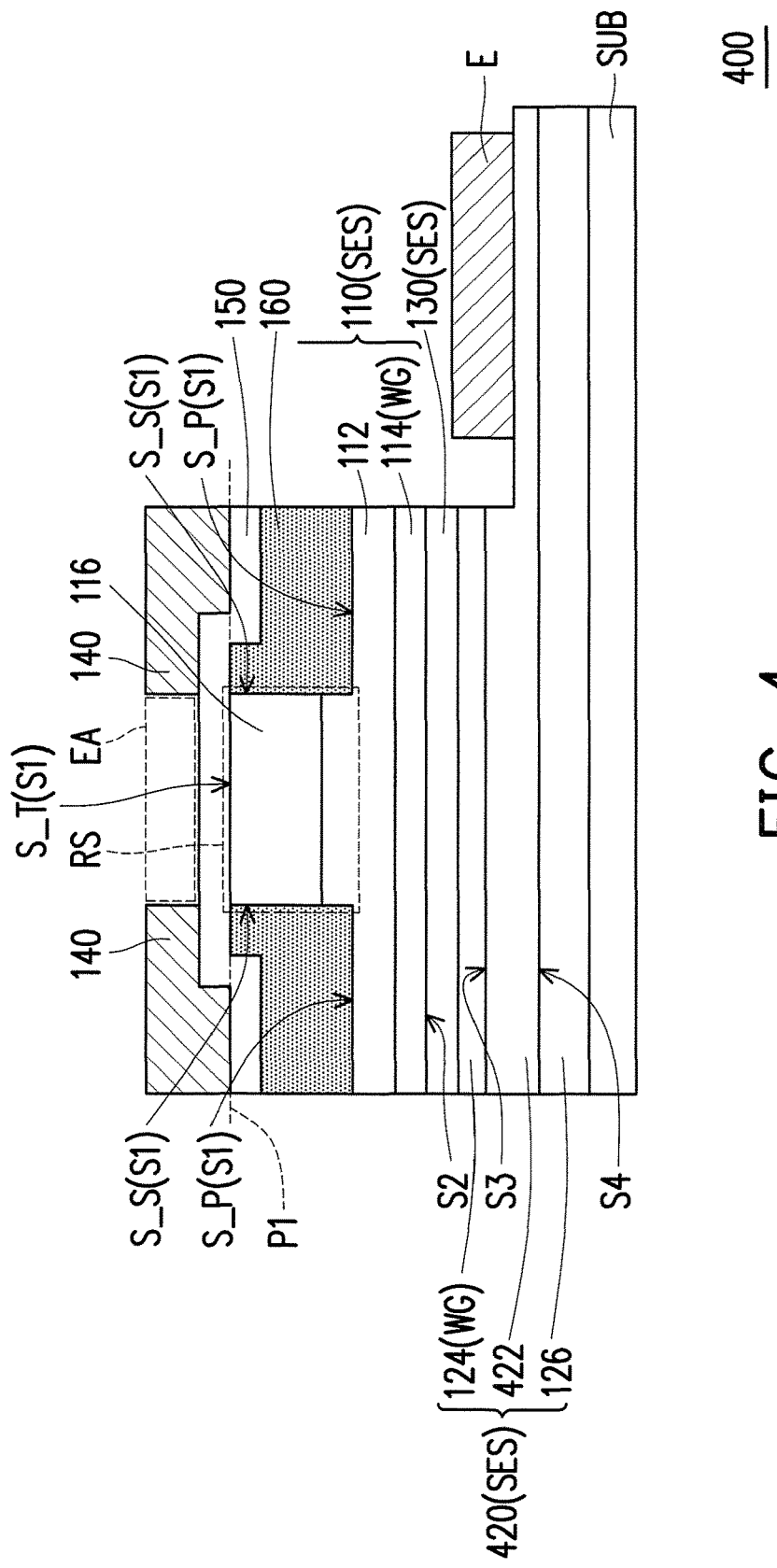
FIG. 4 is a schematic cross-sectional view of a semiconductor laser device according to another embodiment of the invention.

FIG. 4 is a schematic cross-sectional view of a semiconductor laser device according to another embodiment of the invention. Please refer to FIG. 4. The semiconductor laser device 400 depicted in FIG. 4 is similar to the semiconductor laser device 100 depicted in FIG. 1A and FIG. 1B. Components and functions thereof have been specified in the embodiments related to the semiconductor laser device 100 depicted in FIG. 1A and FIG. 1B and thus are not repeated hereinafter. The differences between the semiconductor laser devices 400 and 100 are described below. In the present embodiment, one side of the second semiconductor cladding layer 422 of the second semiconductor layer 420 of the semiconductor laser device 400 facing the light emitting layer 130 (i.e., the third side S3) has a surface that includes a first portion and a second portion. The second waveguide layer 124 is disposed on the first portion of the surface, and the electrode E is disposed on the second portion of the surface. That is, the second waveguide layer 124 and the electrode E are disposed on the same surface at one side of the second semiconductor cladding layer 422, and the substrate SUB and the semiconductor material layer 126 are located on the same surface at the other side of the second semiconductor cladding layer 422 (i.e., the fourth side S4).

In the present embodiment, the substrate SUB of the semiconductor laser device 400 is, for example, a sapphire substrate or is made of any other non-conductive or conductive material. Particularly, the semiconductor laser device 400 is an LD with a horizontal structure, for instance, and the semiconductor laser device 100 depicted in FIG. 1A and FIG. 1B, the semiconductor laser device 200 depicted in FIG. 2, and the semiconductor laser device 300 depicted in FIG. 3 are LDs with vertical structures, for instance. However, the semiconductor laser devices provided in the embodiments of the invention may also refer to LDs with other structures or other types of light emitting devices with different structures, and the invention is not limited thereto. Particularly, the semiconductor laser device 400 provided in the present embodiment can achieve at least the effects that are accomplished by the semiconductor laser device 100 depicted in FIG. 1A and FIG. 1B, i.e., the semiconductor laser device 400 can have small optical loss and favorable light emitting efficiency without sacrificing electrical and optical performance.

Figure 5A:
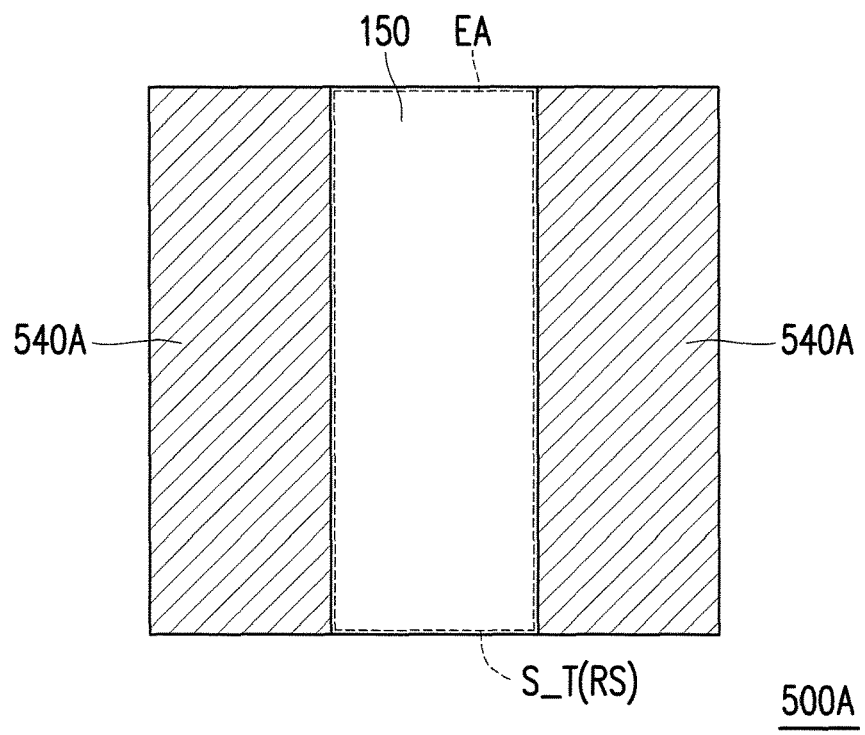
FIG. 5A to FIG. 5G are schematic top views of semiconductor laser devices according to several embodiments of the invention.

FIG. 5A to FIG. 5G are schematic top views of semiconductor laser devices according to several embodiments of the invention. The semiconductor laser device depicted in FIG. 5A-FIG. 5G respectively is similar to the semiconductor laser device 100 depicted in FIG. 1A and FIG. 1B. Components and functions thereof have been specified in the embodiments related to the semiconductor laser device 100 depicted in FIG. 1A and FIG. 1B and thus are not repeated hereinafter. The differences between the semiconductor laser device respectively depicted in FIG. 5A-FIG. 5G and the semiconductor laser device 100 are described below. With reference to FIG. 5A, in the present embodiment, the empty area EA of the electrode pad layer 540A of the semiconductor laser device 500A exposes the transparent conductive layer 150, and the shape of the top surface S_T of the ridged structure RS is the same as the shape of the empty area EA. In particular, for the purpose of clear illustration, the overlapping boundaries of the electrode pad layer 540, the empty area EA, and the top surface S_T have to be slightly separated in FIG. 5A. Practically speaking, an orthogonal projection of the top surface S_T along a direction perpendicular to the light emitting layer coincides with an orthogonal projection of the empty area EA along the direction. Besides, as shown in other drawings (e.g., FIG. 1 to FIG. 4 and FIG. 5B to FIG. 5G), the overlapping segments may also be slightly separated in the manner similar to the illustration in FIG. 5A for illustrative purposes.

Figure 5B:
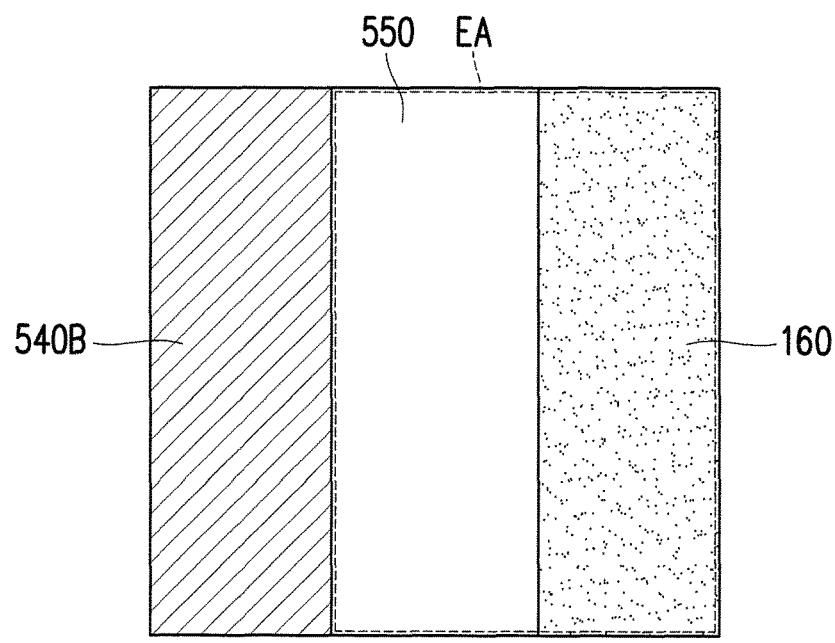

With reference to FIG. 5B, in the present embodiment, the semiconductor laser device 500B is similar to the semiconductor laser device 300 depicted in FIG. 3, for instance. The transparent conductive layer 550 of the semiconductor laser device 500B covers one portion of the insulation layer 160 but does not cover the other portion. Additionally, no electrode pad layer 340 is disposed on the other portion of the insulation layer 160 which is not covered by the transparent conductive layer 550. The empty area EA of the transparent conductive layer 550 is overlapped with one portion of the transparent conductive layer 550 and one portion of the insulation layer 160. A filler (e.g., the filler 370) may be selectively disposed on the other portion of the insulation layer 160 which is not covered by the transparent conductive layer 550. However, the invention is not limited thereto.

Figure 5C:
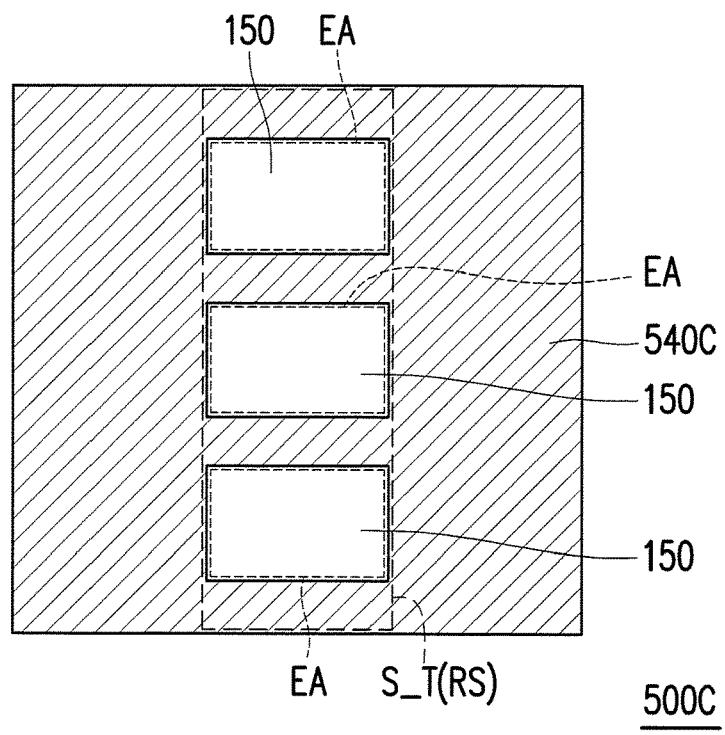
Figure 5D:
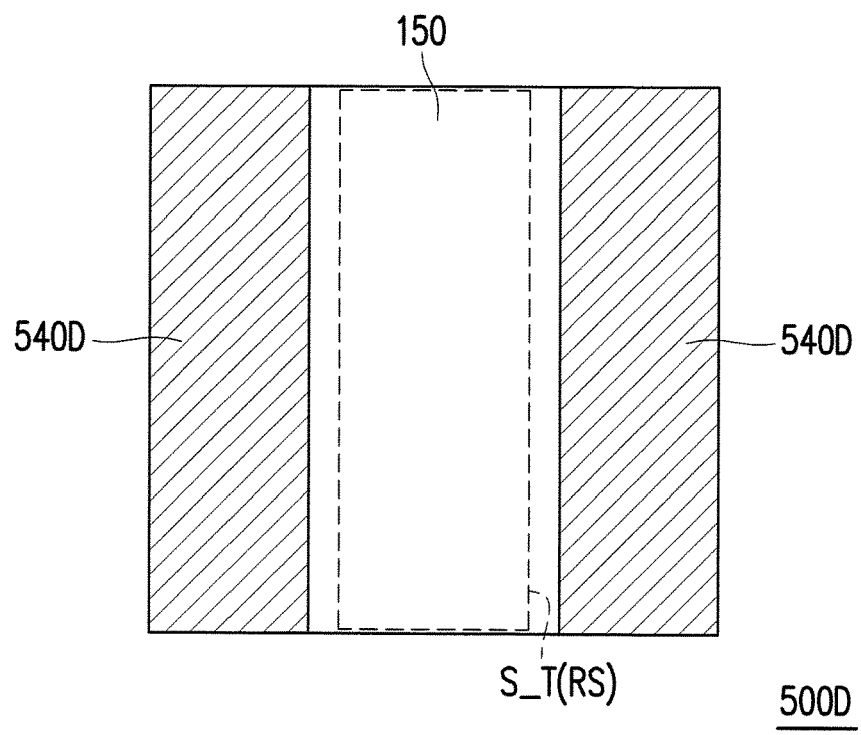
Figure 5E:
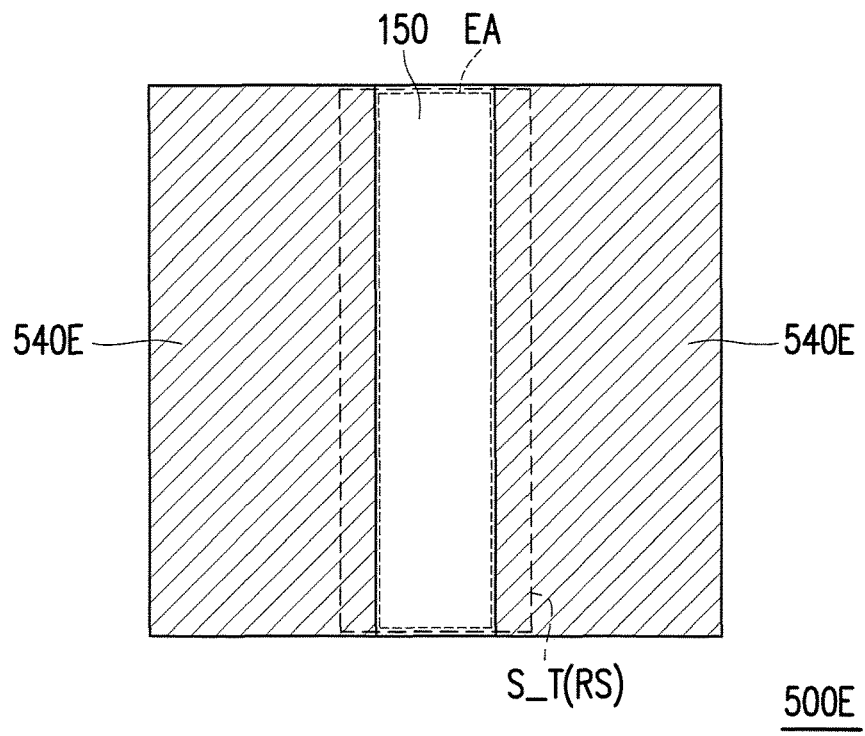
Figure 5F:
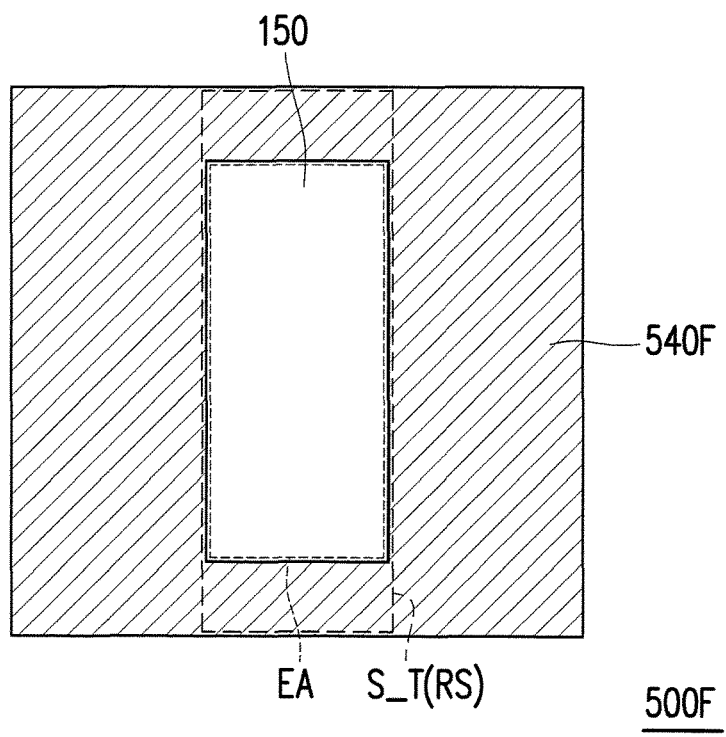

With reference to FIG. 5C, in the present embodiment, the at least one empty area EA of the electrode pad layer 540C of the semiconductor laser device 500C refers to plural empty areas EA which are respectively overlapped with one portion of the top surface S_T of the ridged structure RS. Please refer to FIG. 5D to FIG. 5F. In the embodiment depicted in FIG. 5D, the area of the empty area EA of the electrode pad layer 540D of the semiconductor laser device 500D is greater than an area of the top surface S_T of the ridged structure RS, for instance. According to the present embodiment, the electrode pad layer 540D is not overlapped with the top surface S_T of the ridged structure RS, for instance. In the embodiment depicted in FIG. 5E, the area of the empty area EA of the electrode pad layer 540E of the semiconductor laser device 500E is smaller than an area of the top surface S_T of the ridged structure RS, for instance. In the embodiment depicted in FIG. 5F, the area of the empty area EA of the electrode pad layer 540F of the semiconductor laser device 500F is also smaller than an area of the top surface S_T of the ridged structure RS, for instance.

Figure 5G:
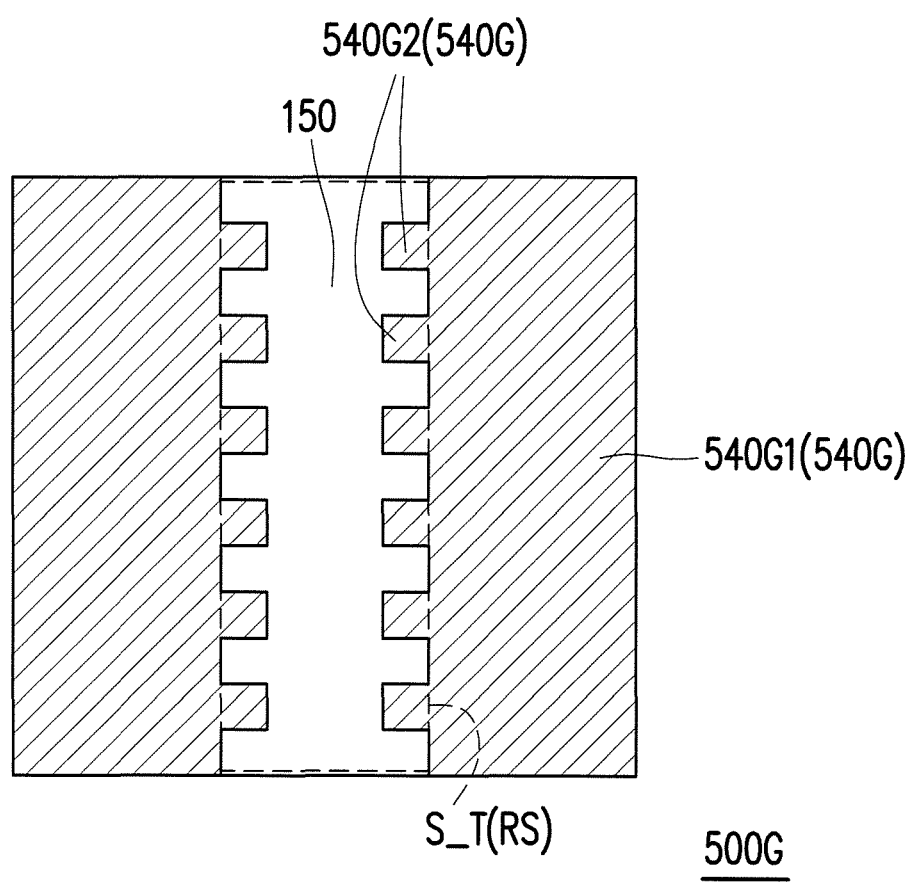

With reference to FIG. 5G, in the present embodiment, the electrode pad layer 540G of the semiconductor laser device 500G includes a first portion (i.e., the first portion 540G1 of the electrode pad layer) and a plurality of second portions (i.e., the second portions 540G2 of the electrode pad layer) connected to the first portion. The second portions 540G2 of the electrode pad layer are disposed on the top surface S_T and are arranged at regular intervals. Here, the intersections of the first portion 540G1 and the second portions 540G2 of the electrode pad layer are aligned to the edge of the top surface S_T of the ridged structure RS. In particular, the shape of the electrode pad layer 540G can be designed according to actual light emitting demands. Through the structural design of at least the transparent conductive layer 150, the insulation layer 160, the ridged structure RS, and the electrode pad layer 540G, the electrical current may evenly enter the semiconductor epitaxial structure SES of the semiconductor laser device 500G, such that the semiconductor laser device 500G is able to achieve favorable optical confinement effects and form the required light patterns. Particularly, the semiconductor laser devices 500A-500G depicted in FIG. 5A to FIG. 5G and provided in the previous embodiments can achieve at least the effects that are accomplished by the semiconductor laser device 100 depicted in FIG. 1A and FIG. 1B, i.e., the semiconductor laser devices 500A-500G can have small optical loss and favorable light emitting efficiency without sacrificing electrical and optical performance.

To sum up, the semiconductor epitaxial structure of the semiconductor laser device provided herein includes the first semiconductor layer, the second semiconductor layer, and the light emitting layer. The light emitting layer is disposed between the first semiconductor layer and the second semiconductor layer, and the first semiconductor layer has the ridged structure on one side away from the light emitting layer. The first semiconductor layer is disposed between the electrode pad layer and the light emitting layer, and the transparent conductive layer is disposed between the electrode pad layer and the first semiconductor layer. Besides, the electrode pad layer has at least one empty area, and an orthogonal projection of the at least one empty area along a direction perpendicular to the light emitting layer is overlapped with at least one portion of an orthogonal projection of the ridged structure along the direction. That is, the electrode pad layer does not completely cover the ridged structure of the first semiconductor layer and thus does not absorb a significant amount of light emitted by the light emitting layer; as such, the optical loss of the semiconductor laser device is reduced. In addition, the transparent conductive layer may disperse the electrical current supplied from the outside to the electrode pad layer, such that the electrical current may evenly enter the semiconductor epitaxial structure. As a result, the semiconductor laser device provided herein may have small optical loss and favorable light emitting efficiency without sacrificing electrical and optical performance.

It will be apparent to those skilled in the art that various modifications and variations can be made to the disclosed embodiments without departing from the scope or spirit of the invention. In view of the foregoing, it should be mentioned that the invention covers modifications and variations of this disclosure provided that they fall within the scope of the following claims and their equivalents.

What is claimed is:

1. A semiconductor laser device comprising:
a semiconductor epitaxial structure comprising:
a first semiconductor layer;
a second semiconductor layer; and
a light emitting layer disposed between the first semiconductor layer and the second semiconductor layer, wherein one side of the first semiconductor layer away from the light emitting layer has a peripheral surface;
an electrode pad layer, the first semiconductor layer being disposed between the electrode pad layer and the light emitting layer;
a transparent conductive layer disposed between the electrode pad layer and the first semiconductor layer, wherein the first semiconductor layer has a ridged structure on one side away from the light emitting layer, the ridged structure comprises a side surface and a top surface, the side surface of the ridged structure connects the top surface of the ridged structure to the peripheral surface, the electrode pad layer has at least one empty area, and an orthogonal projection of the at least one empty area along a direction perpendicular to the light emitting layer is overlapped with at least one portion of an orthogonal projection of the ridged structure along the direction; and
an insulation layer disposed between the first semiconductor layer and the transparent conductive layer, and the insulation layer covering at least one portion of the peripheral surface of the first semiconductor layer, wherein the transparent conductive layer is disposed between the insulation layer and the electrode pad layer.

2. The semiconductor laser device as recited in claim 1, wherein the ridged structure has a top surface away from the light emitting layer, and the orthogonal projection of the at least one empty area on the top surface is overlapped with at least one portion of the top surface.

3. The semiconductor laser device as recited in claim 2, wherein a shape of the top surface is identical to a shape of the at least one empty area, and the top surface coincides with the orthogonal projection of the at least one empty area on the top surface.

4. The semiconductor laser device as recited in claim 2, wherein a quantity of the at least one empty area is plural, and the orthogonal projections of the empty areas on the top surface are respectively overlapped with one portion of the top surface.

5. The semiconductor laser device as recited in claim 2, wherein the electrode pad layer comprises a first portion and a plurality of second portions connected to the first portion, and the second portions of the electrode pad layer are disposed on the top surface and are arranged at regular intervals.

6. The semiconductor laser device as recited in claim 1, wherein the insulation layer covers the side surface of the ridged structure and one portion of the top surface of the ridged structure.

7. The semiconductor laser device as recited in claim 1, wherein the insulation layer covers the side surface of the ridged structure, and the insulation layer and the top surface of the ridged structure are aligned with a horizontal plane.

8. The semiconductor laser device as recited in claim 1, wherein the transparent conductive layer covers at least one portion of the insulation layer and covers the top surface of the ridged structure.

9. The semiconductor laser device as recited in claim 7, wherein an orthogonal projection of the transparent conductive layer along a direction perpendicular to the light emitting layer coincides with an orthogonal projection of the top surface of the ridged structure along the direction.

10. The semiconductor laser device as recited in claim 1, wherein the first semiconductor layer further comprises a first semiconductor cladding layer of a first doped type and a first waveguide layer of the first doped type, the second semiconductor layer further comprises a second semiconductor cladding layer of a second doped type and a second waveguide layer of the second doped type, the first waveguide layer is disposed between the first semiconductor cladding layer and the light emitting layer, the second waveguide layer is disposed between the second semiconductor cladding layer and the light emitting layer, one of the first doped type and the second doped type is a p-type, and the other is an n-type.

11. The semiconductor laser device as recited in claim 10, wherein the first semiconductor layer further comprises a semiconductor contact layer of the first doped type, the semiconductor contact layer is disposed between the transparent conductive layer and the first semiconductor cladding layer, and the semiconductor contact layer is in contact with the transparent conductive layer.

12. The semiconductor laser device as recited in claim 1, wherein the semiconductor laser device is an edge emitting laser.

13. The semiconductor laser device as recited in claim 1, further comprising:

an electrode disposed on one side of the second semiconductor layer away from the light emitting layer, wherein the electrode pad layer has an electrical property identical to the electrode.

14. The semiconductor laser device as recited in claim 1, wherein the transparent conductive layer covers a first portion of the insulation layer and uncovers a second portion of the insulation layer, the semiconductor laser device further comprises a filler disposed on the second portion of the insulation layer.

15. The semiconductor laser device as recited in claim 14, wherein the filler is aligned with the electrode pad layer.

16. The semiconductor laser device as recited in claim 1, wherein the insulation layer completely covers the peripheral surface and the side surface of the ridged structure.

17. A semiconductor laser device comprising:
a semiconductor epitaxial structure comprising:
a first semiconductor layer;
a second semiconductor layer; and
a light emitting layer disposed between the first semiconductor layer and the second semiconductor layer, wherein one side of the first semiconductor layer away from the light emitting layer has a peripheral surface;
an electrode pad layer, the first semiconductor layer being disposed between the electrode pad layer and the light emitting layer;
a transparent conductive layer disposed between the electrode pad layer and the first semiconductor layer, wherein the first semiconductor layer has a ridged structure on one side away from the light emitting layer, the ridged structure comprises a side surface and a top surface, the side surface of the ridged structure connects the top surface of the ridged structure to the peripheral surface, the electrode pad layer has at least one empty area, and an orthogonal projection of the at least one empty area along a direction perpendicular to the light emitting layer is overlapped with at least one portion of an orthogonal projection of the ridged structure along the direction; and
an insulation layer disposed between the first semiconductor layer and the electrode pad layer, wherein an orthogonal projection of the electrode pad layer along a direction perpendicular to the light emitting layer overlaps with an orthogonal projection of the insulation layer along the direction.

18. The semiconductor laser device as recited in claim 17, wherein the ridged structure has a top surface away from the light emitting layer, and the transparent conductive layer is merely disposed on the top surface.

* * * * *